(12) United States Patent
Kumar et al.

(10) Patent No.: US 11,336,294 B2
(45) Date of Patent: May 17, 2022

(54) HYBRID, ADAPTIVE VIRTUAL MEMORY COMPRESSION

(71) Applicant: Apple Inc., Cupertino, CA (US)

(72) Inventors: Derek R. Kumar, Cupertino, CA (US); Thomas Brogan Duffy, Jr., San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/491,740

(22) Filed: Apr. 19, 2017

(65) Prior Publication Data
US 2017/0357454 A1    Dec. 14, 2017

Related U.S. Application Data

(60) Provisional application No. 62/348,669, filed on Jun. 10, 2016.

(51) Int. Cl.
*H03M 7/30* (2006.01)
*H03M 7/46* (2006.01)

(52) U.S. Cl.
CPC ............... *H03M 7/30* (2013.01); *H03M 7/46* (2013.01); *H03M 7/6094* (2013.01)

(58) Field of Classification Search
None
See application file for complete search history.

(56) References Cited

U.S. PATENT DOCUMENTS

| | | | |
|---|---|---|---|
| 6,624,761 B2 | 9/2003 | Fallon | |
| 6,725,225 B1* | 4/2004 | Kori | G06F 3/0607 707/693 |
| 7,161,506 B2 | 1/2007 | Fallon | |
| 7,190,284 B1* | 3/2007 | Dye | G06F 12/023 341/51 |
| 7,400,274 B2 | 7/2008 | Fallon et al. | |
| 7,417,568 B2 | 8/2008 | Fallon et al. | |
| 7,714,747 B2 | 5/2010 | Fallon | |
| 7,777,651 B2 | 8/2010 | Fallon et al. | |
| 9,141,632 B1* | 9/2015 | Ramesh | G06F 17/30091 |
| 9,319,792 B1* | 4/2016 | Coleman | H04R 3/12 |
| 9,952,771 B1* | 4/2018 | Bigman | G06F 3/0608 |
| 2006/0190643 A1* | 8/2006 | Kedem | G06F 3/0671 710/68 |
| 2008/0155353 A1* | 6/2008 | Craske | G06F 11/3636 714/45 |
| 2010/0198889 A1* | 8/2010 | Byers | G06F 17/302 707/827 |
| 2011/0145486 A1* | 6/2011 | Owa | G06F 12/0246 711/103 |
| 2011/0264871 A1* | 10/2011 | Koifman | G06F 3/0623 711/154 |
| 2013/0342375 A1* | 12/2013 | Manning | H03M 7/30 341/87 |

(Continued)

*Primary Examiner* — Stephanie Wu
(74) *Attorney, Agent, or Firm* — Womble Bond Dickinson (US) LLP

(57) ABSTRACT

A method and apparatus of a device that compresses an object stored in memory is described. In an exemplary embodiment, the device receives an indication that the object is to be compressed. The device further selects one of a plurality of compression algorithms based on at least a characteristic of the object. In addition, the device compresses the object in-memory using the selected compression algorithm.

16 Claims, 12 Drawing Sheets

(56) References Cited

U.S. PATENT DOCUMENTS

| | | | |
|---|---|---|---|
| 2015/0324606 A1* | 11/2015 | Grondin | H04L 63/205 |
| | | | 726/1 |
| 2015/0339059 A1* | 11/2015 | Kang | G06F 12/023 |
| | | | 711/154 |
| 2016/0371190 A1* | 12/2016 | Romanovskiy | G06F 3/064 |
| 2017/0003977 A1* | 1/2017 | Sumida | G06F 9/45558 |
| 2017/0090775 A1* | 3/2017 | Kowles | G06F 3/0608 |
| 2017/0185313 A1* | 6/2017 | Golden | G06F 3/0608 |
| 2017/0220256 A1* | 8/2017 | Balasubramonian | G06F 3/061 |
| 2017/0351453 A1* | 12/2017 | Malladi | G06F 11/3037 |
| 2017/0359221 A1* | 12/2017 | Hori | H04L 41/0896 |
| 2017/0371580 A1* | 12/2017 | Kowles | G06F 3/0638 |
| 2018/0364947 A1* | 12/2018 | Jean | G06F 3/064 |

* cited by examiner

HYBRID, ADAPTIVE VIRTUAL MEMORY COMPRESSION

RELATED APPLICATIONS

Applicant claims the benefit of priority of prior, provisional application Ser. No. 62/348,669, filed Jun. 10, 2016, the entirety of which is incorporated by reference.

FIELD OF INVENTION

This invention relates generally to memory management and more particularly to compressing a memory object using one of a variety of compression algorithms based on at least a characteristic of the object, object metadata available to the operating system, and/or a history of compression characteristics maintained by the virtual memory system.

BACKGROUND OF THE INVENTION

Virtual memory is a memory management technique that maps memory virtual addresses used by a running application into physical addresses in computer memory. Main storage as seen by a process or task appears as a contiguous address space or collection of contiguous segments. The operating system manages virtual address spaces and the assignment of real memory to virtual memory. Address translation hardware in the central processing unit (CPU) translates virtual addresses to physical addresses. Software within the operating system may extend these capabilities to provide a virtual address space that can exceed the capacity of real memory and thus reference more memory than is physically present in the computer.

The virtual memory management system can also compress inactive memory objects and may page the compressed object to a swap file. Virtual memory compression is done using a general-purpose compression algorithm that can operate on all types data presented to the virtual memory subsystem. However, the objects resident in memory on a general-purpose computer can comprise many types, including images, text, machine instructions, audio and video, databases of various types or other types of data. The general-purpose compression algorithm does not work optimally for the different types of objects when compared with compression algorithms that are targeted for specific types of data.

SUMMARY OF THE DESCRIPTION

A method and apparatus of a device that compresses an object stored in memory is described. In an exemplary embodiment, the device receives an indication that the object is to be compressed from a virtual memory subsystem of the device. The device further selects one of a plurality of compression algorithms based on at least a characteristic of the object, wherein the object characteristic is derived from a further object characteristic selected from the group consisting of an operating system object tag describing a use of the object, sampled content of the object, and a history of compression characteristics of another object stored in memory. In addition, the device compresses the object in-memory using the selected compression algorithm.

In a further embodiment, a non-transitory machine-readable medium containing executable program instructions which when executed by a data processing device cause the device to perform a method to compress an object stored in memory of the device. In this embodiment, the method of the machine-readable medium receives an indication that the object is to be compressed from a virtual memory subsystem of the device. The method of the machine-readable medium further selects one of a plurality of compression algorithms based on at least a characteristic of the object, wherein the object characteristic is derived from a further object characteristic selected from the group consisting of an operating system object tag describing a use of the object, sampled content of the object, and a history of compression characteristics of another object stored in memory. In addition, the method of the machine-readable medium compresses the object in-memory using the selected compression algorithm.

In a further embodiment, the method of the machine-readable medium additionally retrieves the operating system tag associated with the object and determines the object characteristic based on the operating system tag. The operating system tag associated with the object is associated to the object when memory for the object is allocated. The method of the machine-readable medium stores the compressed object in a swap file and determines the object characteristic.

In another embodiment, the method of the machine-readable medium samples the contents of the object and determines the object characteristic based on at least the sample contents. In yet another embodiment, the method of the machine-readable medium determines the object characteristic based on at least a history-based predictor using the history of compression characteristics of the another object stored in memory. The method of the machine-readable medium additionally determines a compression ratio of the compressed object and stores the compression ratio. In addition, the memory is virtual memory and the object characteristic indicates the type of object.

In another embodiment, a method compresses an object stored in memory of the device. In this embodiment, the method receives an indication that the object is to be compressed from a virtual memory subsystem of the device. The method further selects one of a plurality of compression algorithms based on at least a characteristic of the object, wherein the object characteristic is derived a further object characteristic selected from the group consisting of an operating system object tag describing a use of the object, sampled content of the object, and a history of compression characteristics of another object stored in memory. In addition, the method compresses the object in-memory using the selected compression algorithm.

In a further embodiment, the method stores the compressed object in a swap file and determines the object characteristic. The method additionally retrieves the operating system tag associated with the object and determines the object characteristic based on the operating system tag. The operating system tag associated with the object is associated to the object when memory for the object is allocated.

In another embodiment, the method samples the contents of the object and determines the object characteristic based on at least the sample contents. In yet another embodiment, the method determines the object characteristic based on at least a history-based predictor using the history of compression characteristics of the another object stored in memory.

The method additionally determines a compression ratio of the compressed object and stores the compression ratio. In addition, the memory is virtual memory and the object characteristic indicates the type of object.

Other methods and apparatuses are also described.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
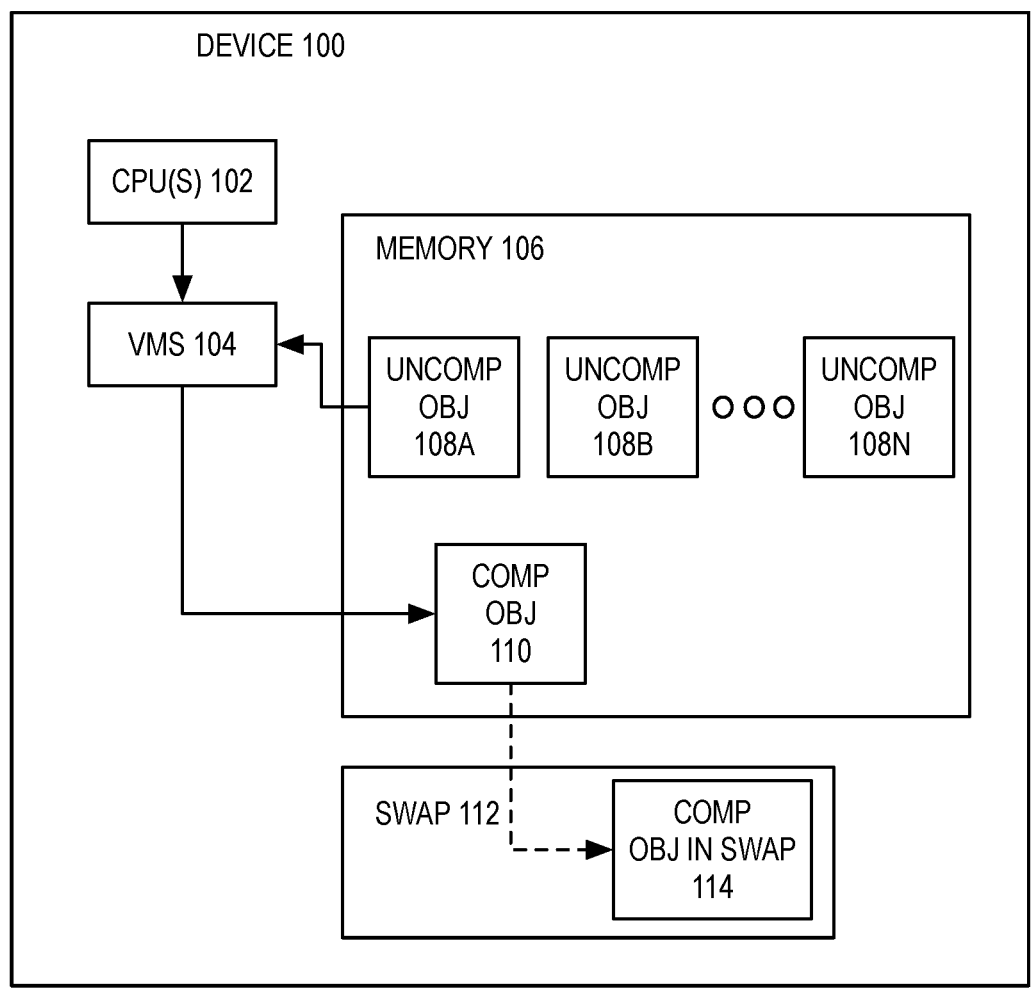
FIG. 1 is a block diagram of one embodiment of a device that compresses objects in memory.

A method and apparatus of a device that compresses an object stored in memory is described. In the following description, numerous specific details are set forth to provide thorough explanation of embodiments of the present invention. It will be apparent, however, to one skilled in the art, that embodiments of the present invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow, are performed by processing logic that comprises hardware (e.g., circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially.

The terms "server," "client," and "device" are intended to refer generally to data processing systems rather than specifically to a particular form factor for the server, client, and/or device.

A method and apparatus of a device that compresses an object stored in memory is described. In one embodiment, the device receives an indication that an object is to be compressed. An object could be compressed because the object is inactive (e.g., there has not been a memory access to the object for a certain amount of time) or there can be memory pressure as the device is running out of memory for current running application. The device further characterizes the object, where the device can use this object characterization to select one of multiple compression algorithms available to the device. For example and in one embodiment, the object can be a textual, image, video, audio, binary, or another type of object. The device can characterize the object by determining if the object has an associated operating system tag describing its origin and use, sampling the contents of the object, and/or using a history based predictor. Using the object characterization, the device selects a compression algorithm to compress the object. For example and in one embodiment, there may be a compression algorithm that is better suited for text, a different compression algorithm better suited for image, a further compression algorithm better suited for image, and so on. In one embodiment, the device selects the compression algorithm based on at least the object characterization, a predicted compression ratio for the object, and/or an amount of time that it takes the compression algorithm to run. The device further records the compression results in a compression history record, which the history-based predictor can subsequently use to characterize other objects.

FIG. 1 is a block diagram of one embodiment of a device 100 that compresses objects in memory. In FIG. 1, the client device can be a personal computer, laptop, server, mobile device (e.g., smartphone, laptop, personal digital assistant, music playing device, gaming device, etc.), and/or any type of device capable of compressing an object in memory. In one embodiment, the client 100 can be a physical or virtual device.

In one embodiment, the device 100 includes a central processing unit (CPU) 102, virtual memory subsystem (VMS) 104, and memory 106. While in one embodiment, the device 100 includes one CPU 102, in alternative embodiments, the device includes multiple CPUs 102. In one embodiment, the CPU 102 is a general-purpose processing device such as a microprocessor or another type of processor. More particularly, the CPU 102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The central processing unit (CPU) 102 may also be one or more special-purpose processing devices such as an application specific integrated circuit (ASIC), a field programmable gate array (FPGA), a digital signal processor (DSP), network processor, or the like. In one embodiment, the CPU 102 can include one or more CPUs and each of the CPUs can include one or more processing cores.

The VMS 104, in one embodiment, manages the use of the memory. In this embodiment, the VMS 104 performs virtual memory management, handling at the same time memory protection, cache control, and bus arbitration. Furthermore, and in one embodiment, the VMS 104 manages the use of the memory by compressing objects stored in memory, so as to free up space in memory 106. By freeing up space in memory, there is also less of a need to swap object to swap 112 as the compressed object 110 is smaller than the uncompressed object 108A. In this embodiment, instead of using a general purpose compression algorithm for each and every memory object to be compressed, the VMS 104 characterizes each object to be compressed to determine a type of object that is stored in memory. For example and in one embodiment, a stored uncompressed object 108A-N can be a text, image, video, audio, binary, or another type of object. In one embodiment, if one of the uncompressed objects is to be compressed, the VMS 104 characterizes the object so as to determine the type of object. With this characterization, the VMS 104 selects a compression algorithm for that object type. For example and in one embodiment, there may be a compression algorithm that is better suited for text, a different compression algorithm better suited for image, a further compression algorithm better suited for image, and so on. In this embodiment, the VMS 104 selects the compression based on a predicted compression ratio for the object and an amount of time that it takes the compression algorithm to run. In one embodiment, a compression algorithm is an algorithm that takes uncompressed object and reduces the size of the uncompressed object to give a compressed object. In this embodiment, the compression algorithm reduces the size of the object by identifying and eliminating statistical redundancy.

In one embodiment, the memory 106 stores many uncompressed objects 108A-N. In this embodiment, the memory 106 can be dynamic random access memory (DRAM). If the amount of free memory space is below a threshold or the VMS 104 identifies that one of the uncompressed objects 108A-N has not accessed in some time, the VMS 104 compresses one or more of the uncompressed objects 108A-N by characterizing that object 108A-N, selecting a compression algorithm for that object 108A-N, and compressing that object 108A-N into a compressed object 110. If the device 100 includes a swap file, the VMS 104 may further move the compressed object 110 from memory to the swap 112, where this compressed object is now stored in the swap 114. While in one embodiment, the device 100 includes a swap 112, in alternate embodiments, the device 100 does not include a swap 112. In this embodiment, the device 100 compresses the uncompressed objects 108A-N without storing the compressed object 110 in the swap 112.

Figure 2:
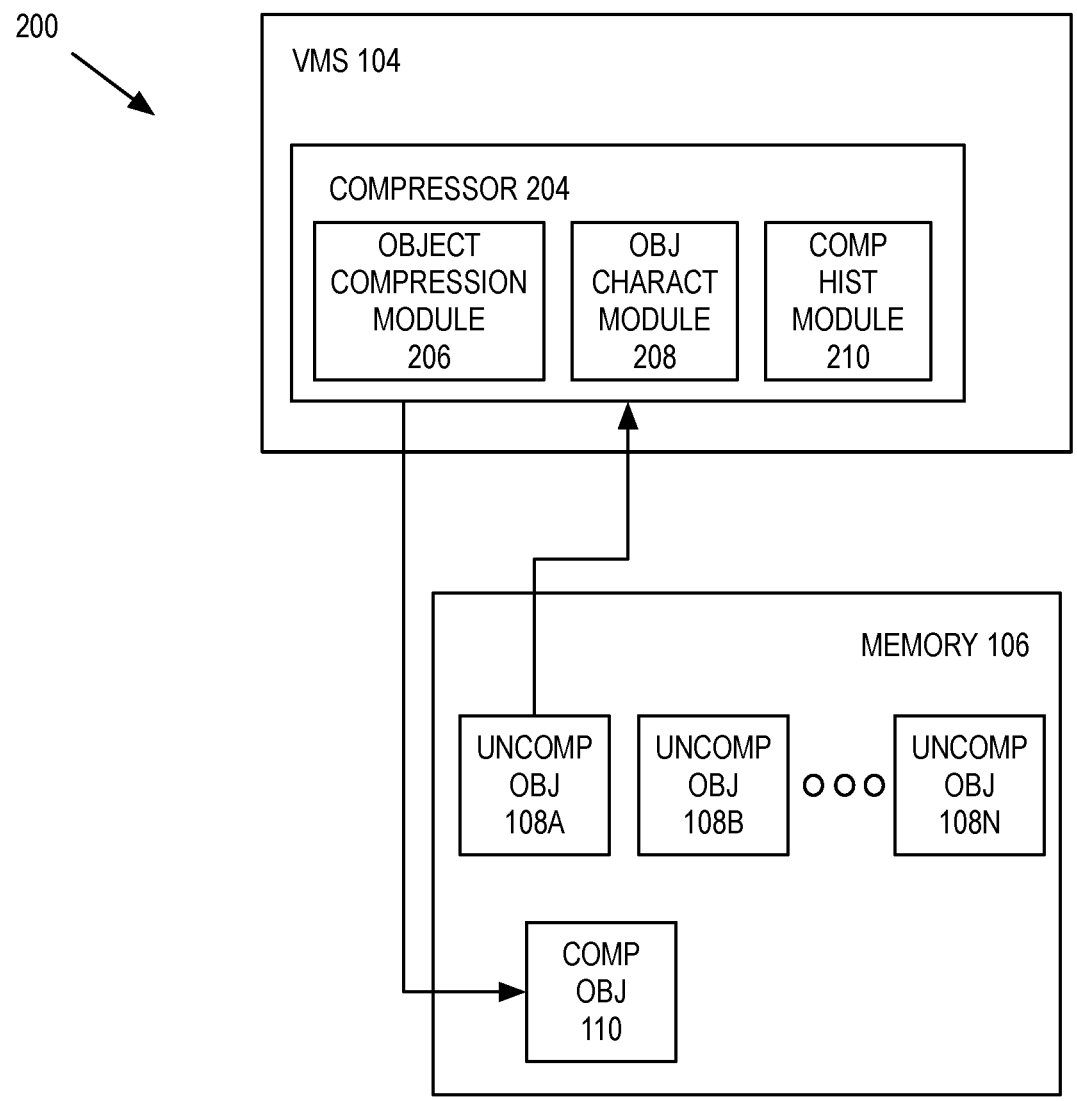
FIG. 2 is a block diagram of one embodiment of a virtual memory subsystem that compresses objects in memory.

FIG. 2 is a block diagram of one embodiment of a VMS 104 that compresses objects in memory. In FIG. 2, the system 200 includes the VMS 104 that compresses uncompressed objects 108A-N stored in memory 106 using a compressor 204. In one embodiment, the VMS 104 includes compressor 204 that characterizes the object to be compressed, selects a compression algorithm based on at least the object characterization, and compresses the object. For example and in one embodiment, compressor 204 is compresses one of the uncompressed objects 108A-N stored in memory 106 and converts the uncompressed object 108A-N into a compressed object 110. For example and in one embodiment, if the compressor 204 characterizes the uncompressed object 108A as a binary object, the compressor 204 selects a compression that is better suited for a binary object and uses this compression algorithm to compress this object 108A to the compressed object 110.

In one embodiment, the compressor 204 includes object compression module 206, object characterization module 208, and compression history module 210. In this embodiment, object compression module 206 compresses the object using the selected compression algorithm. Object compression is further described in FIG. 3 below. In addition, the object characterization module 208 characterizes the object using one of a variety of object characterization mechanism. For example and in one embodiment, the object characterization module 208 can characterize the object by determining if the object has an associated operating system tag describing its origin and use, sampling the contents of the object, and/or using a history based predictor. Object characterization is further described in FIG. 5 below. The compression history module 210 records the compression history as further described in FIG. 6 below.

Figure 3:
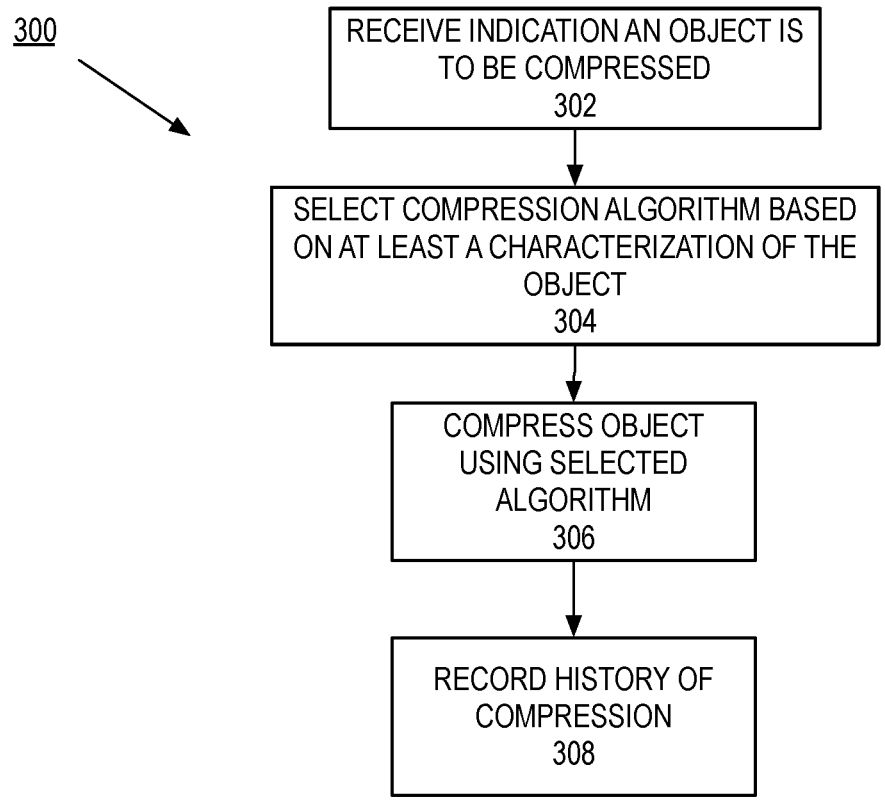
FIG. 3 is a flow diagram of one embodiment of a process to compress an object.

FIG. 3 is a flow diagram of one embodiment of a process 300 to compress an object. In one embodiment, process 300 is performed by an object compression module to compress the object, such as the object compression module 206 as described in FIG. 2 above. In FIG. 3, process 300 begins by receiving an indication that an object is to be compressed at block 302. In one embodiment, an object may be compressed in memory based on the working set management algorithm of the virtual memory subsystem (whose inputs include the level of demand for physical memory), the recency of use of the object in question, and/or other factors. At block 304, process 300 selects a compression algorithm based on at least a characterization of this object. In one embodiment, the object can be an image, audio, video, binary/executable, or some other type of object. In another embodiment, the object can be characterized based on data patterns within the memory used for this object. For example and in one embodiment, the object may be sparse, where the object occupies a large amount of memory, but there is not much nonzero data stored for the object. Characterization of the object is further described in FIG. 5 below.

Using this object characterization, process 300 selects a compression algorithm for this object. In one embodiment, if the type of data stored for this object (e.g., image, audio, video, binary/executable, text, or some other type) can be determined, process 300 selects a compression algorithm for this type. For example and in one embodiment, process 300 can select a variety of compression algorithms for different types of objects (e.g., image (joint photographic experts group (JPEG), graphics interchange format (GIF), or some other type of image compression), audio (e.g., free lossless audio codec (FLAC), Apple lossless (ALAC), Windows media audio 9 lossless (WMA lossless), and/or some other type of audio compression), video (e.g., moving pictures experts group (MPEG)-4, H.264, and/or some other type of video compression), and/or a general compression algorithm (e.g., Lempel-Ziv, DEFLATE, Lempel-Ziv-Renau, and/or some other type of general data compression). In one embodiment, the compression algorithm is a lossless data compression algorithm, where the object can be compressed and uncompressed without any loss of data. In addition to the object characterization, process 300 can also select the compression algorithm based on the amount of time predicted that the compression algorithm would take. In one embodiment, because this memory object compression runs while the user is using the device, process 300 may not select compression algorithm that takes a long time, so as not to interfere with the user's operation of the device.

At block 306, process 300 compresses the object using the selected algorithm. Process 300 records the history of the compression at block 308. In one embodiment, process 300 records the compression ratio, the time the compression algorithm took, the object, the object type, and the compression algorithm used. This information can be used later by history-based predictor to characterize future objects stored in memory.

Figure 4:
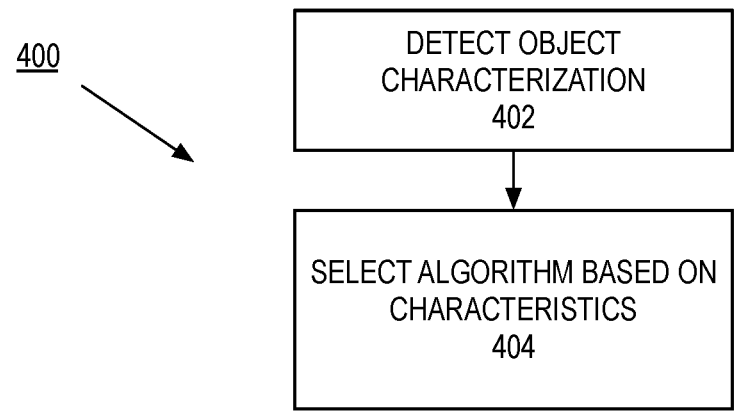
FIG. 4 is a flow diagram of one embodiment of a process to selects a compression algorithm to compress an object based on an object characterization.

FIG. 4 is a flow diagram of one embodiment of a process 400 to selects a compression algorithm to compress an object based on an object characterization. In one embodiment, process 400 is performed by a select algorithm module that selects a compression algorithm to compress an object based on an object characterization such as the select algorithm module 704 as described in FIG. 7 below. In FIG. 4, process 400 begins by detecting an object for compression. For example and in one embodiment, process 400 characterizes the object by determining if the object has an associated operating system tag describing its origin and use, sampling the contents of the object, and/or using a history based predictor. Object characterization is further described in FIG. 5 below. At block 404, process 400 selects an algorithm based on the characteristics of the object. In one embodiment, process 400 can select from one of a variety of compression algorithms for different types of objects (e.g., image (JPEG, GIF, or some other type of image compression), audio (e.g., free lossless audio codec (FLAC), Apple lossless (ALAC), Windows media audio 9 lossless (WMA lossless), and/or some other type of audio compression), video (e.g., moving pictures experts group (MPEG)-4, H.264, and/or some other type of video compression), and/or a general compression algorithm (e.g., Lempel-Ziv, DEFLATE, Lempel-Ziv-Renau, and/or some other type of general data compression). In one embodiment, the compression algorithm is a lossless data compression algorithm, where the object can be compressed and uncompressed without any loss of data. In addition to the object characterization, process 400 can also select the compression algorithm based on the amount of time predicted that the compression algorithm would take. In one embodiment, because this memory object compression runs while the user is using the device, process 400 may not select compression algorithm that takes a long time, so as not to interfere with the user's operation of the device.

Figure 5:
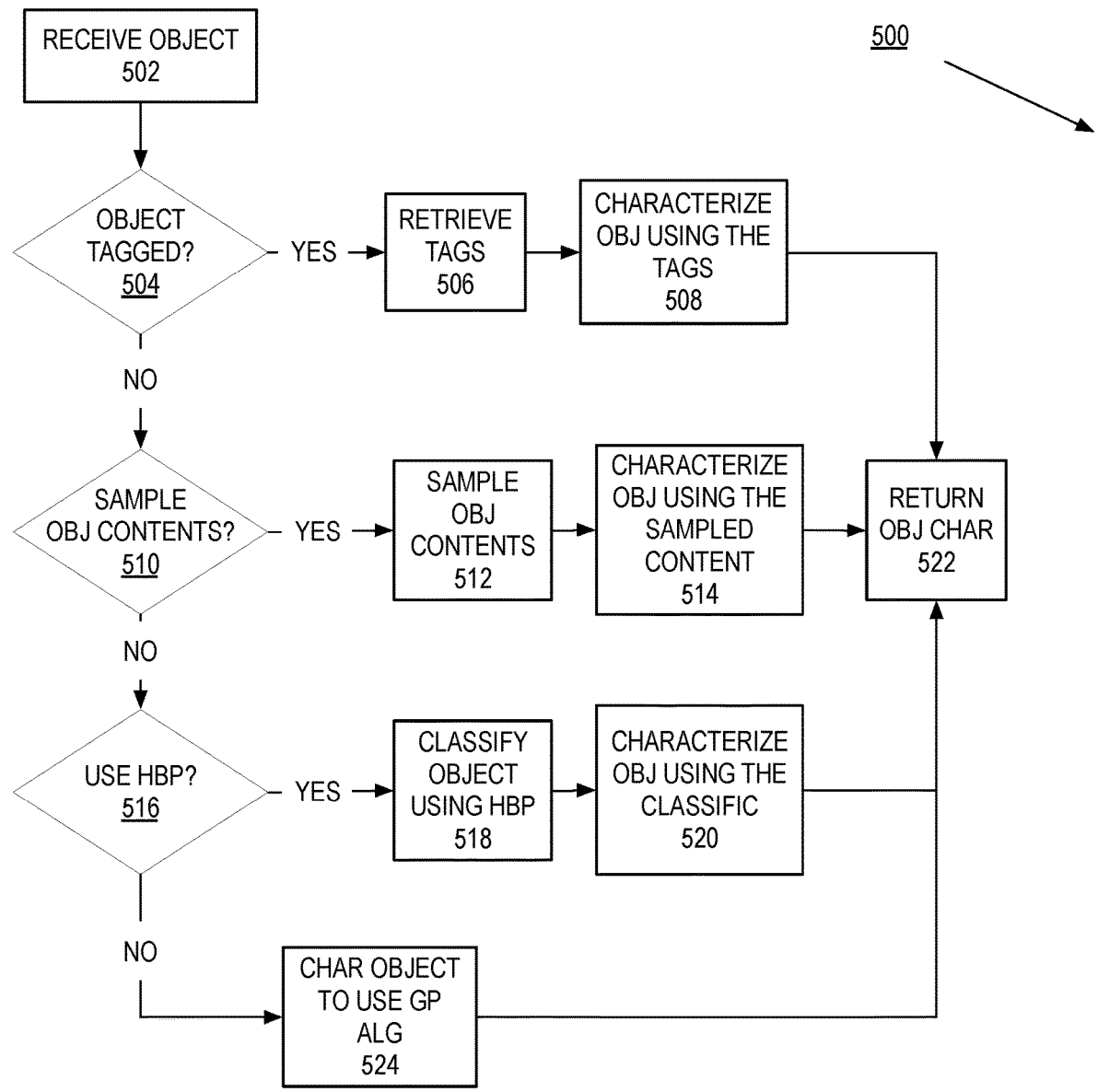
FIG. 5 is a flow diagram of one embodiment of a process to characterize an object.

FIG. 5 is a flow diagram of one embodiment of a process 500 to characterize an object. In one embodiment, process 500 is performed by an object characterization module that characterizes an object, such as the object characterization module 208 as described in FIG. 2 above. In FIG. 5, process 500 begins by receiving the object at block 502. In one embodiment, process 500 receives the object by receiving a reference to that object. At block 504, process 500 determines if the object has an associated operating system tag describing its origin and use. In one embodiment, the object can be tagged by the operating system when the memory for this object is allocated. For example and in one embodiment, metadata available to the operating system includes virtual memory "tags" assigned by allocators operating in user tasks. In this example, virtual regions are tagged as containing image data by some allocators, and other ranges are inferable as containing machine instructions as these ranges are marked with execute privileges in pagetable entries interpreted by the processor's VMS. Other common categories include memory allocated to back the camera, user interface elements, just-in-time compilation of javascript, and/or other types of categories.

If the object is tagged, at block 506, process 500 retrieves the tags for this object. Process 500 characterizes the object using the tag at block 508. For example in one embodiment, if the tag for the object indicates that the object is an image, audio, video, machine instruction, the object is characterized as an image, audio, video, machine instruction, respectively. Execution proceeds to block 522 below.

If the object is not tagged, execution proceeds to block 510. At block 510, process 500 determines if the characterization of the object can be done by sampling the object contents. If the object can be characterized by sampling the object contents, process 500 samples the object contents at block 512. In one embodiment, process 500 uses a fast algorithm to sample portions of the object and classify the data into various categories, such as image-like or machine-instruction-like, to determine the appropriate choice of compression algorithm. Process 500 characterizes the object using the sampled content at block 514. Execution proceeds to block 522 below.

If process 500 cannot sample the object contents or get an object characterization from the sampled object contents, process 500 determines if a history based predictor can be used to classify the object at block 516. In one embodiment, the compressor typically operates in phases where numerous granules (e.g., "pages") of DRAM-resident data are compressed. Such data typically belongs to the same "access epoch" or working-set-interval, where multiple granules were populated or accessed at similar intervals. In other words, the input data typically has some level of temporal locality. Similarly, the virtual memory system is aware of spatial locality, e.g., ranges that have been allocated contiguously in the virtual address space. Using these properties, a history-based predictor can be constructed to achieve a more optimal selection of virtual memory compression algorithm. If a prior virtual memory granule which was either spatially or temporally co-located with the current granule was compressed to a satisfactory compression ratio by one algorithm, process 500 indicates that the current granule will probabilistically contain similar data (e.g. an image) and achieve good compression ratios with an image-compression algorithm, rather than a text or machine instruction specific algorithm. Similarly, a negative indicator from a prior memory granule could suggest that another algorithm should be evaluated. This type of history-based predictor can also assist in reducing the computation overhead of the hybrid compression mechanism, by identifying sequences of pages that are incompressible or poorly compressible by one or all algorithms, in which case the mechanism can choose to abandon compression attempts until a few more granules are processed, or tagging or sampling mechanisms might signal profitability of a new algorithm.

If process 500 can use a history-based predictor to characterize the object, process 500 classifies the object using a history-based predictor at block 518. In one embodiment, process 500 can classify the object using the history-based predictor into a type of object (e.g., image, audio, or some other type of object). Process 500 characterizes the object using the classification of block 520. Execution proceeds to 522 below.

If process 500 cannot use the history-based predictor to characterize the object, at block 524, process 500 characterizes the object to use a general-purpose compression algorithm at block 524. In one embodiment the general-purpose compression algorithm is a compression algorithm that can be used for the different types of objects. In one embodiment, process 500 characterizes the object as having no characterization. Execution proceeds to block 522. At block 522, process 500 returns the object characterization.

Figure 6:
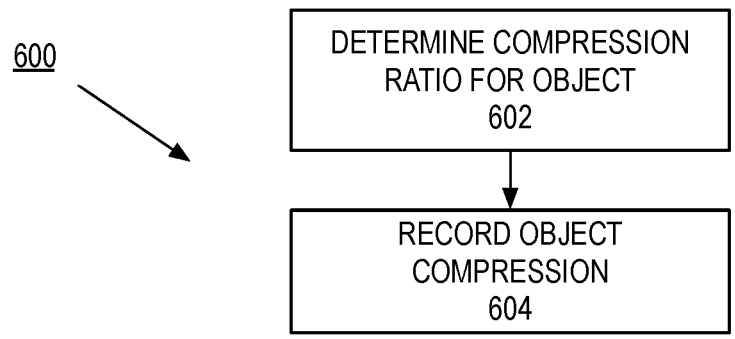
FIG. 6 is a flow diagram of one embodiment of a process to record object compression ratio.

FIG. 6 is a flow diagram of one embodiment of a process 600 to record object compression ratio. In one embodiment, process 600 performed by a compression history module to record the object compression ratio, such as the compression history module 210 as described in FIG. 2 above. In FIG. 6, process 600 begins by determining the compression ratio for the object at block 602. In one embodiment, the compression ratio for an object is the size of the uncompressed object divided by the size of the compressed object. At block 604, process 600 records the object compression. In one embodiment, process 600 records the compression ratio, the compression algorithm used, the time used to compress the object, the object, the object type, and/or other types of information regarding the compression of the object. In this embodiment, by recording the compression ratio, the compression history can be used by the history-based predictor to determine which compression algorithm to use.

Figure 7:
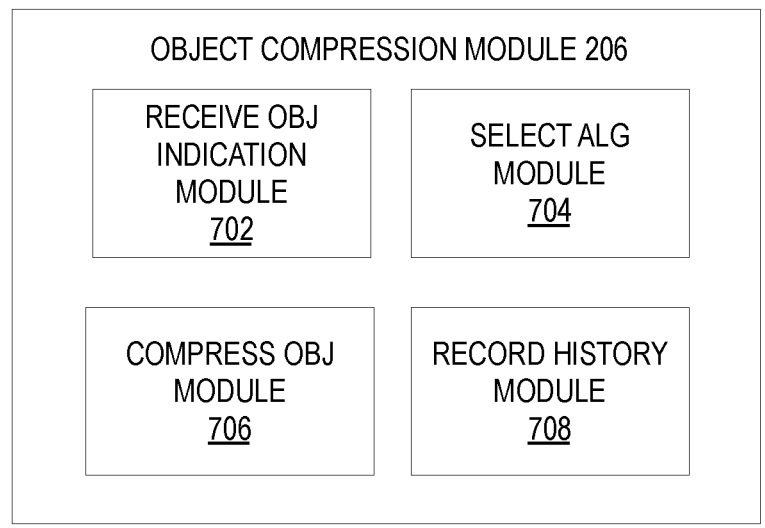
FIG. 7 is a block diagram of one embodiment of an object compression module that compresses objects.

FIG. 7 is a block diagram of one embodiment of an object compression module 206 that compress an object. In one embodiment, the object compression module 206 includes a receive object indication module 702, select algorithm module 704, compress object module 706, and record history model 708. In one embodiment, the receive object indication module 702 receives an indication that an object is to be compressed as described in FIG. 3 block above. The select algorithm module 704 selects the compression algorithm to use based on at least a characterization of the object as described in FIG. 3, block 304 above. The compress object module 706 compresses the object using the selected algorithm as described in FIG. 3, block 306 above. The record history module 708 records the history of the object compression as described in FIG. 3, block 308 above.

Figure 8:
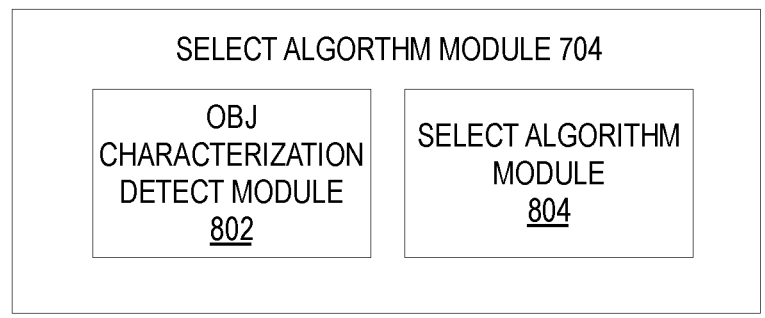
FIG. 8 is a block diagram of one embodiment of a select algorithm module that selects a compression algorithm to compress an object based on an object characterization.

FIG. 8 is a block diagram of one embodiment of a select algorithm module 704 that selects a compression algorithm to compress an object based on an object characterization. In one embodiment, the select algorithm module 704 includes the detect object characterization module 802 and the select algorithm module 804. In one embodiment the detect object characterization module 802 detects the object characterization as described in FIG. 4, block 402 above. The select algorithm module 804 before selects the compression algorithm based on the object characteristic as described in FIG. 4, block 404 above.

Figure 9:
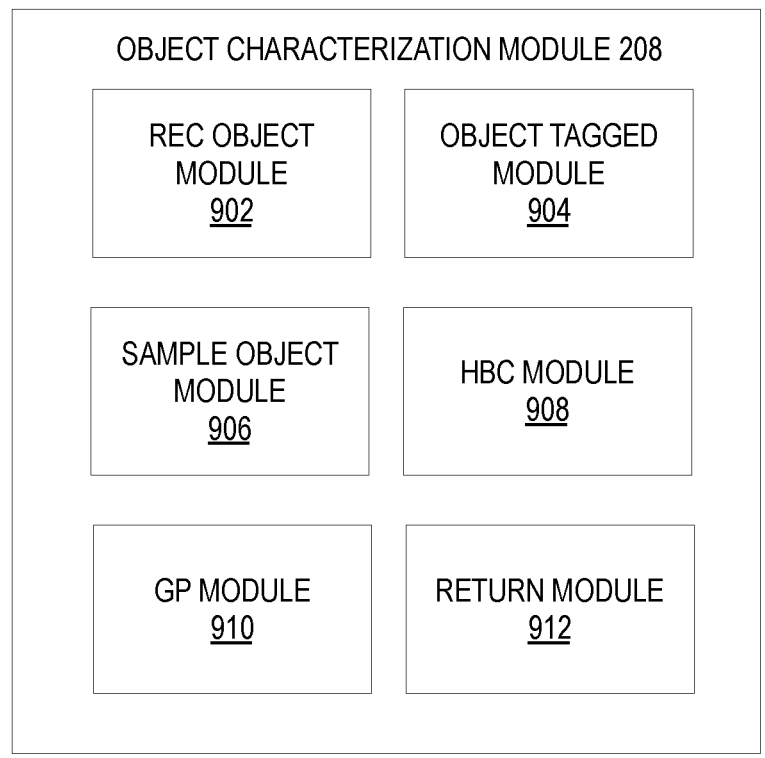
FIG. 9 is a block diagram of one embodiment of an object characterization module that characterizes an object.

FIG. 9 is a block diagram of one embodiment of an object characterization module 208 that characterizes an object. In one embodiment, the object characterization module to avoid includes receive object model 902, object tagged module 904, sample object module 906, history based characterization module 908, general-purpose module 910, and return module 912. In one embodiment, the receive object module 902 receives the object as described in FIG. 5, block 502 above. The object tagged module 904 characterizes the object using the object tags as described in FIG. 5, blocks 504-508 above. The sample object module 906 characterizes the object by sampling the content of the object is described in FIG. 5, blocks 510-514 above. The history based characterization module 908 characterizes the object using a history-based predictor as described in FIG. 5, blocks 516-520 above. The general purpose module 910 characterizes an object to use a general-purpose algorithm as described in FIG. 5, block 524 above.

Figure 10:
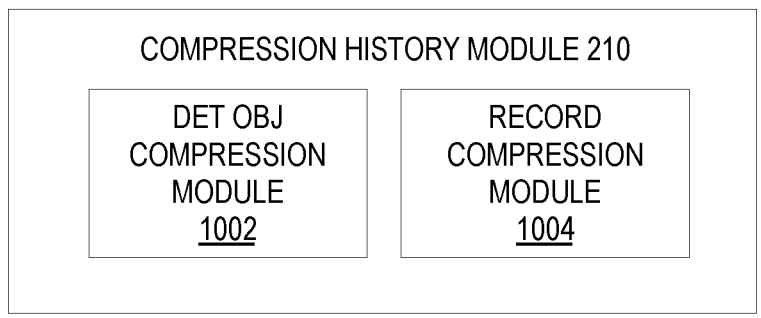
FIG. 10 is a block diagram of one embodiment of a compression history module that records object compression ratio.

FIG. 10 is a block diagram of one embodiment of a compression history module 210 that records object compression ratio. In one embodiment, the compression history module 210 includes a determined object compression module 1002 and record compression module 1004. In one embodiment the determine object compression module 1002 determines a compression ratio for the object as described in FIG. 6, block 602 above. The record compression module 1004 records a record of the object compression as described in FIG. 6, block 604 above.

Figure 11:
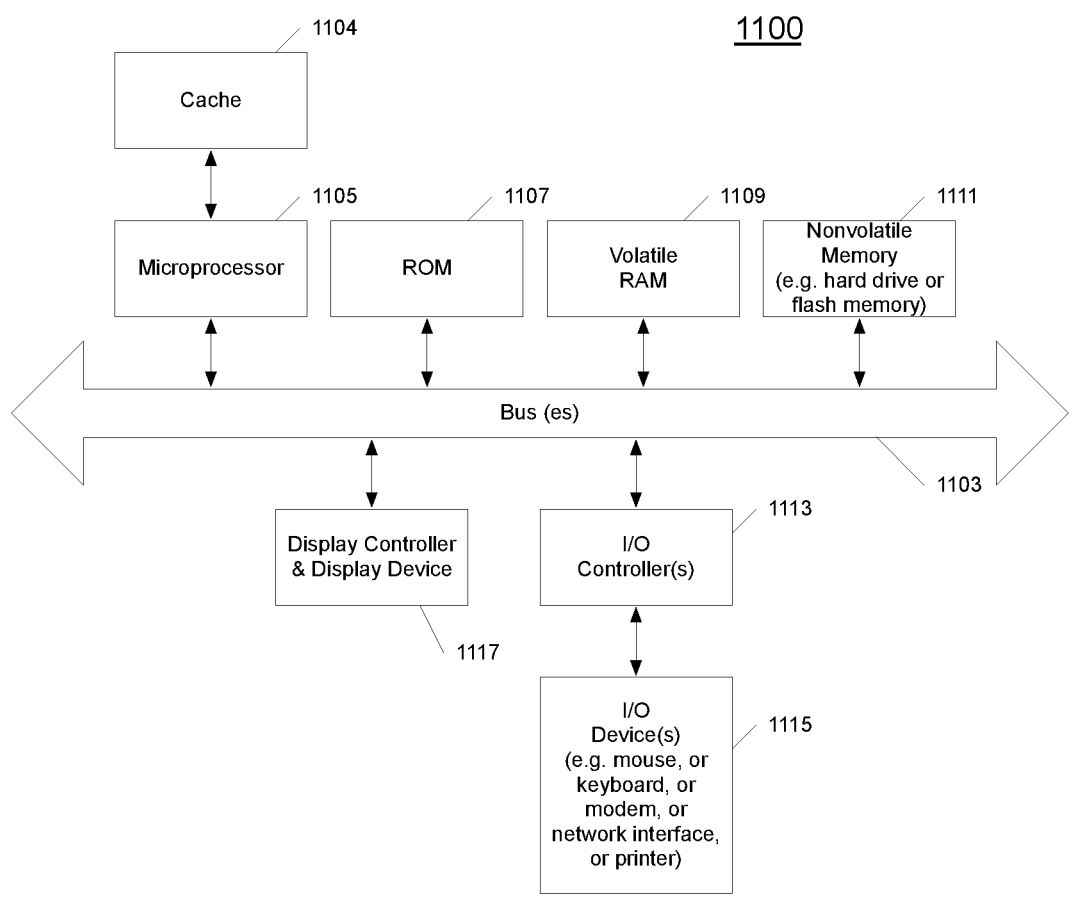
FIG. 11 illustrates one example of a typical computer system, which may be used in conjunction with the embodiments described herein.

FIG. 11 shows one example of a data processing system 1100, which may be used with one embodiment of the present invention. For example, the system 1100 may be implemented including a device 100 as shown in FIG. 1. Note that while FIG. 11 illustrates various components of a computer system, it is not intended to represent any particular architecture or manner of interconnecting the components as such details are not germane to the present invention. It will also be appreciated that network computers and other data processing systems or other consumer electronic devices, which have fewer components or perhaps more components, may also be used with the present invention.

As shown in FIG. 11, the computer system 1100, which is a form of a data processing system, includes a bus 1103 which is coupled to a microprocessor(s) 1105 and a ROM (Read Only Memory) 1107 and volatile RAM 1109 and a non-volatile memory 1111. The microprocessor 1105 may include one or more CPU(s), GPU(s), a specialized processor, and/or a combination thereof. The microprocessor 1105 may retrieve the instructions from the memories 1107, 1109, 1111 and execute the instructions to perform operations described above. The bus 1103 interconnects these various components together and also interconnects these components 1105, 1107, 1109, and 1111 to a display controller and display device 1117 and to peripheral devices such as input/output (I/O) devices which may be mice, keyboards, modems, network interfaces, printers and other devices which are well known in the art. Typically, the input/output devices 1115 are coupled to the system through input/output controllers 1113. The volatile RAM (Random Access Memory) 1109 is typically implemented as dynamic RAM (DRAM), which requires power continually in order to refresh or maintain the data in the memory.

The mass storage 1111 is typically a magnetic hard drive or a magnetic optical drive or an optical drive or a DVD RAM or a flash memory or other types of memory systems, which maintain data (e.g. large amounts of data) even after power is removed from the system. Typically, the mass storage 1111 will also be a random access memory although this is not required. While FIG. 11 shows that the mass storage 1111 is a local device coupled directly to the rest of the components in the data processing system, it will be appreciated that the present invention may utilize a non-volatile memory which is remote from the system, such as a network storage device which is coupled to the data processing system through a network interface such as a modem, an Ethernet interface or a wireless network. The bus 1103 may include one or more buses connected to each other through various bridges, controllers and/or adapters as is well known in the art.

Figure 12:
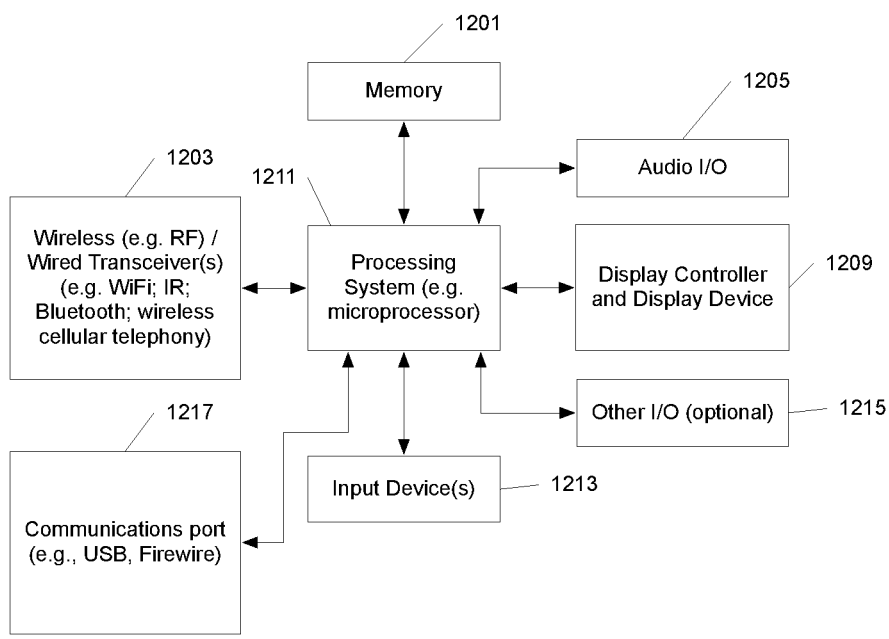
FIG. 12 shows an example of a data processing system, which may be used with one embodiment of the present invention.

FIG. 12 shows an example of another data processing system 1200 which may be used with one embodiment of the present invention. For example, system 1200 may be implemented as a device 100 as shown in FIG. 1. The data processing system 1200 shown in FIG. 12 includes a processing system 1211, which may be one or more microprocessors, or which may be a system on a chip integrated circuit, and the system also includes memory 1201 for storing data and programs for execution by the processing system. The system 1200 also includes an audio input/output subsystem 1205, which may include a microphone and a speaker for, for example, playing back music or providing telephone functionality through the speaker and microphone.

A display controller and display device 1209 provide a visual user interface for the user; this digital interface may include a graphical user interface which is similar to that shown on a Macintosh computer when running OS X operating system software, or Apple iPhone when running the iOS operating system, etc. The system 1200 also includes one or more wireless transceivers 1203 to communicate with another data processing system, such as the system 1200 of FIG. 12. A wireless transceiver may be a WLAN transceiver, an infrared transceiver, a Bluetooth transceiver, and/or a wireless cellular telephony transceiver. It will be appreciated that additional components, not shown, may also be part of the system 1200 in certain embodiments, and in certain embodiments fewer components than shown in FIG. 12 may also be used in a data processing system. The system 1200 further includes one or more communications ports 1217 to communicate with another data processing system, such as the system 1500 of FIG. 15. The communications port may be a USB port, Firewire port, Bluetooth interface, etc.

The data processing system 1200 also includes one or more input devices 1213, which are provided to allow a user to provide input to the system. These input devices may be a keypad or a keyboard or a touch panel or a multi touch panel. The data processing system 1200 also includes an optional input/output device 1215 which may be a connector for a dock. It will be appreciated that one or more buses, not shown, may be used to interconnect the various components as is well known in the art. The data processing system shown in FIG. 12 may be a handheld computer or a personal digital assistant (PDA), or a cellular telephone with PDA like functionality, or a handheld computer which includes a cellular telephone, or a media player, such as an iPod, or devices which combine aspects or functions of these devices, such as a media player combined with a PDA and a cellular telephone in one device or an embedded device or other consumer electronic devices. In other embodiments, the data processing system 1200 may be a network computer or an embedded processing device within another device, or other types of data processing systems, which have fewer components or perhaps more components than that shown in FIG. 12.

At least certain embodiments of the inventions may be part of a digital media player, such as a portable music and/or video media player, which may include a media processing system to present the media, a storage device to store the media and may further include a radio frequency (RF) transceiver (e.g., an RF transceiver for a cellular telephone) coupled with an antenna system and the media processing system. In certain embodiments, media stored on a remote storage device may be transmitted to the media player through the RF transceiver. The media may be, for example, one or more of music or other audio, still pictures, or motion pictures.

The portable media player may include a media selection device, such as a click wheel input device on an iPod® or iPod Nano® media player from Apple, Inc. of Cupertino, Calif., a touch screen input device, pushbutton device, movable pointing input device or other input device. The media selection device may be used to select the media stored on the storage device and/or the remote storage device. The portable media player may, in at least certain embodiments, include a display device which is coupled to the media processing system to display titles or other indicators of media being selected through the input device and being presented, either through a speaker or earphone(s), or on the display device, or on both display device and a speaker or earphone(s). Examples of a portable media player are described in published U.S. Pat. No. 7,345,671 and U.S. published patent number 2004/0224638, both of which are incorporated herein by reference.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The present invention also relates to an apparatus for performing the operations described herein. This apparatus may be specially constructed for the required purpose, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a computer system bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "retrieving," "selecting," "receiving," "determining," "computing," "compressing," "changing," "storing," "sampling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will be evident from the description below. In addition, the present invention is not described with reference to any particular programming language. It will be appreciated that a variety of programming languages may be used to implement the teachings of the invention as described herein.

The foregoing discussion merely describes some exemplary embodiments of the present invention. One skilled in the art will readily recognize from such discussion, the accompanying drawings and the claims that various modifications can be made without departing from the spirit and scope of the invention.

The invention claimed is:

1. A non-transitory machine-readable medium containing executable program instructions which when executed by a data processing device cause the device to perform a method to compress a plurality of objects stored in virtual memory of the device, the method comprising:
receiving a first indication that a first object stored in the virtual memory is to be compressed from a virtual memory subsystem of the device, the first object generated from an application and the virtual memory is mapped into dynamic memory of the device;
receiving a second indication that a second object stored in the virtual memory is to be compressed from the virtual memory subsystem of the device, the second object generated from the application;
selecting a first compression algorithm from a plurality of compression algorithms based on at least a characteristic of the first object, wherein the first object characteristic is determined in response to receiving the first indication and the first object characteristic is related to a type of the first object;
selecting a second compression algorithm from a plurality of compression algorithms based on at least a characteristic of the second object, wherein the second compression algorithm is different from the first compression algorithm and the second object characteristic is determined in response to receiving the second indication and the second object characteristic is related to a type of the second object that is different than the first object type;
compressing the first object in-memory using the first compression algorithm; and
compressing the second object in-memory using the second compression algorithm.

2. The machine-readable medium of claim 1, further comprising:
storing at least one of the compressed first and second objects in a swap file.

3. The machine-readable medium of claim 1, further comprising:
determining the object characteristic for the first and second objects.

4. The machine-readable medium of claim 3, wherein the determining comprises:
retrieving an operating system object tag associated with the first object; and
determining the first object characteristic based on the operating system tag.

5. The machine-readable medium of claim 1, further comprising:
determining a compression ratio of the first compressed object; and
storing the compression ratio.

6. The machine-readable medium of claim 1, wherein the object characteristic indicates a type of object.

7. A method to compress a plurality of objects stored in virtual memory of a device, the method comprising:
receiving a first indication that a first object stored in virtual memory is to be compressed from a virtual memory subsystem of the device, the first object generated from the application;
receiving a second indication that a second object stored in the virtual memory is to be compressed from the virtual memory subsystem of the device, the second object generated from the application and the virtual memory is mapped into dynamic memory of the device;
selecting a first compression algorithm from a plurality of compression algorithms based on at least a characteristic of the first object, wherein the first object characteristic is determined in response to receiving the first indication and the first object characteristic is related to a type of the first object;
selecting a second compression algorithm from a plurality of compression algorithms based on at least a characteristic of the second object, wherein the second compression algorithm is different from the first compression algorithm and the second object characteristic is determined in response to receiving the second indication and the second object characteristic is related to a type of the second object;
compressing the first object in-memory using the first compression algorithm; and
compressing the second object in-memory using the first compression algorithm.

8. The method of claim 7, further comprising:
storing at least one of the compressed first and second objects in a swap file.

9. The method of claim 7, further comprising:
determining the object characteristic.

10. The method of claim 7, further comprising:
determining a compression ratio of the first compressed object; and
storing the compression ratio.

11. A device to compress a plurality of objects stored in virtual memory of the device, the device comprising:
a processor;
a dynamic memory coupled to the processor though a bus; and
a process executed from the dynamic memory by the processor that causes the processor to receive a first indication that a first object stored in the virtual memory is to be compressed from a virtual memory subsystem of the device, the first object generated from an application and the virtual memory is mapped into dynamic memory of the device, receive a second indication that a second object stored in the virtual memory is to be compressed from the virtual memory subsystem of the device, the second object generated from the application, select a first compression algorithm from a plurality of compression algorithms based on at least a characteristic of the first object, wherein the first object characteristic is determined in response to receiving the first indication and the first object characteristic is related to a type of the first object, select a second compression algorithm from a plurality of compression algorithms based on at least a characteristic of the second object, wherein the second compression algorithm is different from the first compression algorithm and the second object characteristic is determined in response to receiving the second indication and the second object characteristic is related to a type of the second object, compress the first object in-memory using the first compression algorithm, and compress the second object in-memory using the second compression algorithm.

12. The device of claim 11, wherein the process causes the processor further to store at least one of the compressed first and second objects in a swap file.

13. The device of claim 11, wherein the process causes the processor further to determine the object characteristic for the first and second objects.

14. The device of claim 13, wherein the determination of the object characteristic causes the processor to retrieving an operating system object tag associated with the first object; and
determining the first object characteristic based on the operating system tag.

15. The device of claim 11, wherein the process causes the processor further to determine a compression ratio of the first compressed object and store the compression ratio.

16. The device of claim 11, wherein the object characteristic indicates a type of object.

* * * * *